(12) United States Patent
Lee et al.

(10) Patent No.: US 8,796,730 B2
(45) Date of Patent: Aug. 5, 2014

(54) POWER SEMICONDUCTOR MODULE

(75) Inventors: Young Ki Lee, Gyunggi-do (KR); Dong Soo Seo, Gyunggi-do (KR); Kwang Soo Kim, Gyunggi-do (KR); Young Hoon Kwak, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/313,713

(22) Filed: Dec. 7, 2011

(65) Prior Publication Data
US 2013/0069108 A1 Mar. 21, 2013

(30) Foreign Application Priority Data

Sep. 16, 2011 (KR) .......................... 10-2011-0093559

(51) Int. Cl.
*H01L 29/739* (2006.01)
(52) U.S. Cl.
USPC ............. 257/133; 257/777; 257/778; 257/64; 257/198; 257/563
(58) Field of Classification Search
USPC ........... 257/777, 778, 64, 198, 563, 528, 723, 257/724
See application file for complete search history.

(56) References Cited

U.S. PATENT DOCUMENTS

| | | | | |
|---|---|---|---|---|
| 5,956,231 A * | 9/1999 | Yamada et al. | ............... | 361/728 |
| 6,774,466 B1 * | 8/2004 | Kajiwara et al. | ............... | 257/673 |
| 6,836,006 B2 * | 12/2004 | Muto et al. | ..................... | 257/686 |
| 2002/0036339 A1 * | 3/2002 | Taguchi et al. | ............... | 257/690 |
| 2002/0043708 A1 * | 4/2002 | Muto et al. | ..................... | 257/686 |
| 2007/0200219 A1 * | 8/2007 | Otremba | ....................... | 257/692 |

FOREIGN PATENT DOCUMENTS

| | | |
|---|---|---|
| JP | 2000-164800 | 6/2000 |
| KR | 10-1990-0007170 | 5/1990 |
| KR | 10-2008-0071054 | 8/2008 |

OTHER PUBLICATIONS

Applicant-provided Office Action issued for related Korean Patent Application No. 10-2011-0093559, dated Nov. 9, 2012, and its English summary, also provided by Applicant.

* cited by examiner

*Primary Examiner* — Lex Malsawma
*Assistant Examiner* — Sheng Zhu
(74) *Attorney, Agent, or Firm* — Ladas & Parry, LLP

(57) ABSTRACT

Disclosed herein is a power semiconductor module including: a circuit board having gate, emitter, and collector patterns formed thereon; a first semiconductor chip mounted on the circuit board, having gate and emitter terminals each formed on one surface thereof, and having a collector terminal formed on the other surface thereof; a second semiconductor chip mounted on the first semiconductor chip, having a cathode terminal formed on one surface thereof, and having an anode terminal formed on the other surface thereof; a first conductive connection member having one end disposed between the collector terminal of the first semiconductor chip and the cathode terminal of the second semiconductor chip and the other end contacting the collector pattern of the circuit board; and a second conductive connection member having one end contacting the anode terminal of the second semiconductor chip and the other end contacting the emitter pattern of the circuit board.

12 Claims, 4 Drawing Sheets

POWER SEMICONDUCTOR MODULE

CROSS REFERENCE TO RELATED APPLICATION

This application claims the benefit of Korean Patent Application No. 10-2011-0093559, filed on Sep. 16, 2011, entitled "Power Semiconductor Module", which is hereby incorporated by reference in its entirety into this application.

BACKGROUND OF THE INVENTION

1. Technical Field

The present invention relates to a power semiconductor module.

2. Description of the Related Art

Recently, slimness, high performance, and multi-function have been demanded in home or industrial electronic components. In addition, due to an environmental regulation problem, many efforts for increasing energy efficiency have been conducted.

Currently, in home appliances such as a washing machine, a refrigerator, an air conditioner, or the like, an inverter module using a power semiconductor has been used in order to raise energy efficiency.

Therefore, high reliability and multi-function have been demanded in a power semiconductor module used as an inverter.

Meanwhile, the power semiconductor motor according to the prior art has been disclosed in Japanese Patent Laid-open Publication No. 2000-164800.

The power semiconductor module according to the prior art includes a diode device stacked on an upper portion of a transistor device mounted on an insulation substrate, using a conductive resin, in order to reduce a longitudinal area thereof.

However, in the power semiconductor module according to the prior art, each terminal of the transistor and diode devices is electrically connected to a circuit though wire bonding.

As described above, since the power semiconductor module according to the prior art is connected to the circuit using the wire, a defect is easily generated. As a result, reliability of a product is reduced and sufficient heat radiating characteristics may not be secured.

SUMMARY OF THE INVENTION

The present invention has been made in an effort to provide a power semiconductor module having high reliability.

Further, the present invention has been made in an effort to provide a power semiconductor module having sufficient heat radiating characteristics.

Further, the present invention has been made in an effort to provide a power semiconductor module having a high-density firm structure.

According to a preferred embodiment of the present invention, there is provided a power semiconductor module including: a circuit board having gate, emitter, and collector patterns formed thereon; a first semiconductor chip mounted on the circuit board, having gate and emitter terminals each formed on one surface thereof and contacting the gate and emitter patterns, and having a collector terminal formed on the other surface thereof; a second semiconductor chip mounted on the first semiconductor chip, having a cathode terminal formed on one surface thereof and contacting the collector terminal, and having an anode terminal formed on the other surface thereof; a first conductive connection member having one end disposed between the collector terminal of the first semiconductor chip and the cathode terminal of the second semiconductor chip and the other end contacting the collector pattern of the circuit board; and a second conductive connection member having one end contacting the anode terminal of the second semiconductor chip and the other end contacting the emitter pattern of the circuit board.

When a portion which the first semiconductor chip contacts in the gate and emitter patterns formed on the circuit board is a first area and a portion which the first semiconductor chip does not contact therein is a second area, the first area may have a concave shape in which it is stepped with respect to the second area.

The first and second conductive connection members may be made of a metal and have a ribbon shape.

The metal may be copper (Cu).

The first semiconductor chip may be an insulated gate bipolar transistor (IGBT), and the second semiconductor chip may be a diode.

The other end of the first conductive connection member may have a bent shape and contact the collector pattern of the circuit board, and the other end of the second conductive connection member may have a bent shape and contact the emitter pattern of the circuit board.

The gate and emitter patterns of the circuit board and the gate and emitter terminals of the first semiconductor chip may be bonded to each other by soldering.

The collector terminal of the first semiconductor chip and the first conductive connection member may be bonded to each other by soldering.

The first conductive connection member and the cathode terminal of the second semiconductor chip may be bonded to each other by soldering.

The anode terminal of the second semiconductor chip and the second conductive connection member may be bonded to each other by soldering.

The second conductive connection member and the emitter pattern of the circuit board may be bonded to each other by soldering.

DESCRIPTION OF THE PREFERRED EMBODIMENTS

Figure 1:
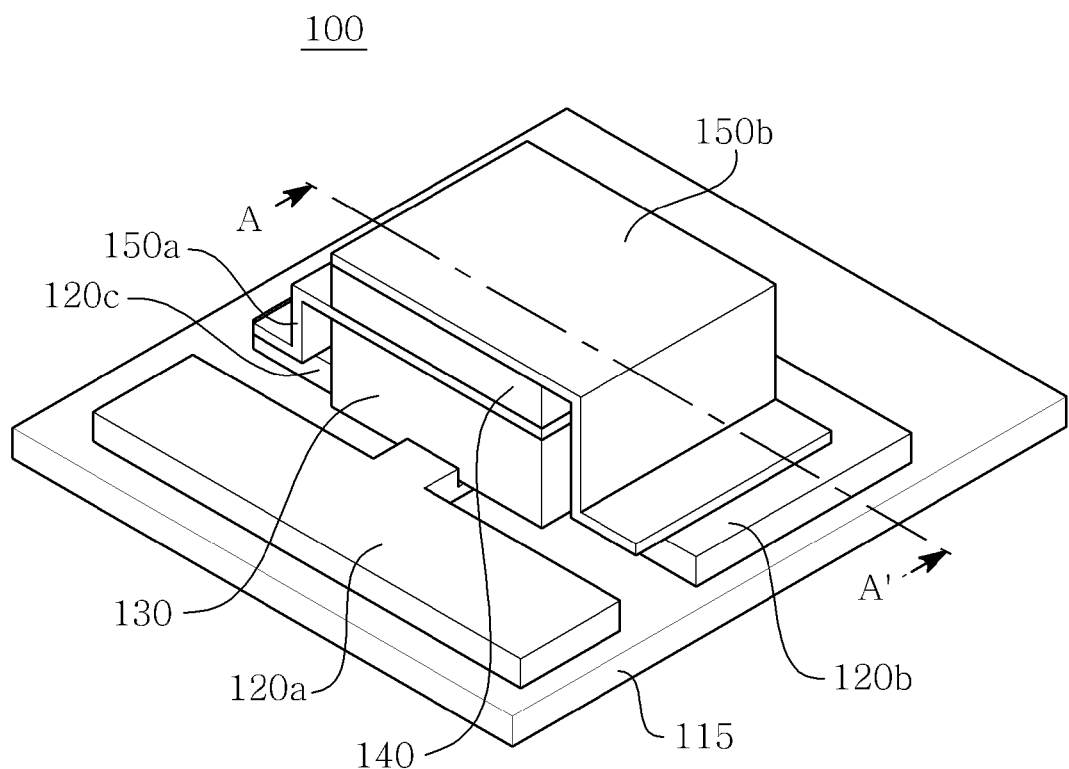
FIG. 1 is a perspective view showing a structure of a power semiconductor module according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from preferred embodiments and the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. In the description, the terms "first", "second", and so on are used to distinguish one element from another element, and the elements are not defined by the above terms.

Hereinafter, preferred embodiments of the present invention will be described in detail with reference to the accompanying drawings.

Figure 2:
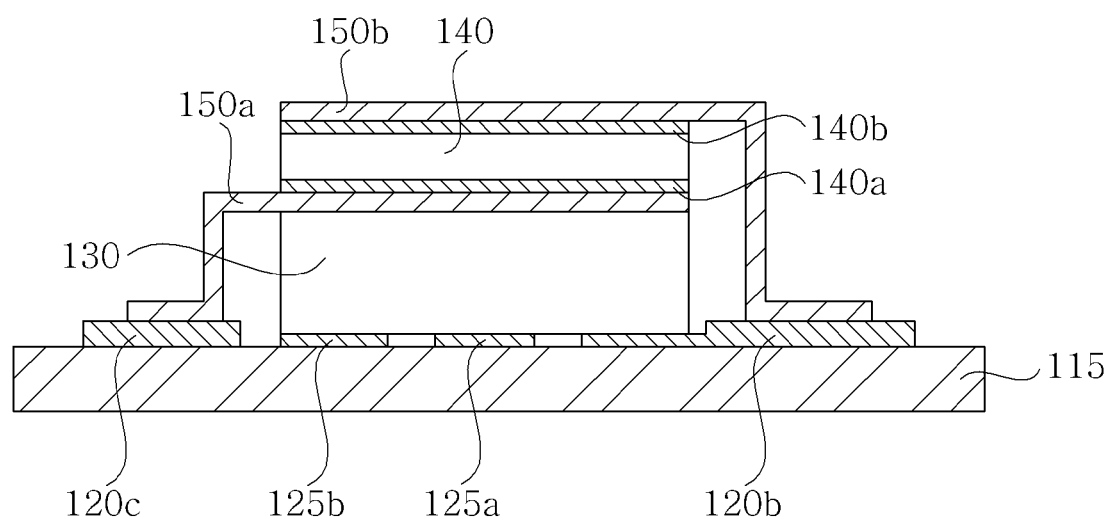
FIG. 2 is a cross-sectional view taken along line A-A' in the structure in the power semiconductor module of FIG. 1.
Figure 4:
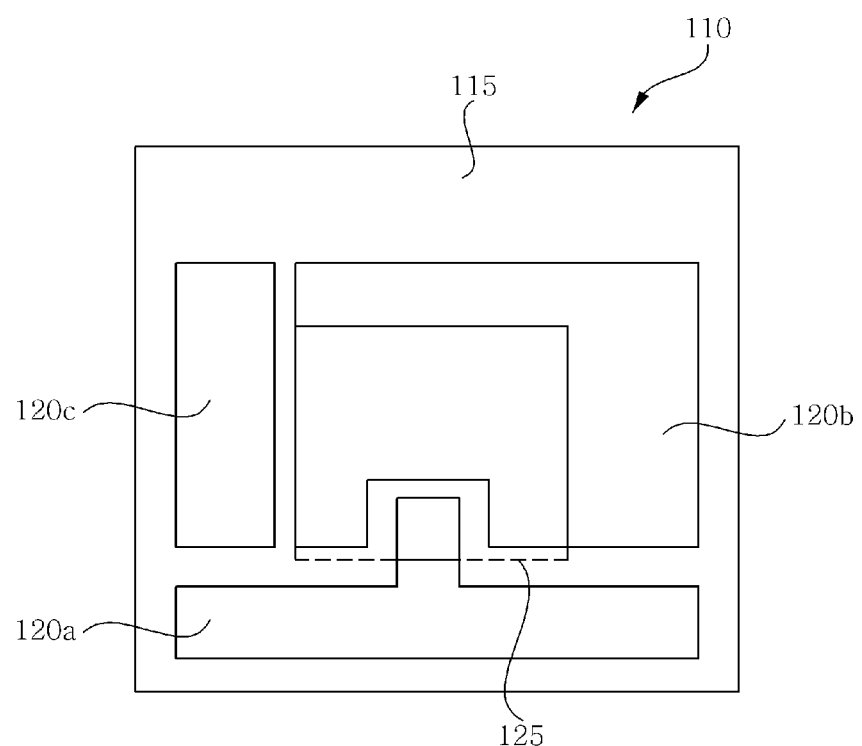
FIG. 4 is a plan view showing a circuit board on which gate, emitter, and collector patterns are formed in the power semiconductor module according to the preferred embodiment of the present invention.
Figure 5:
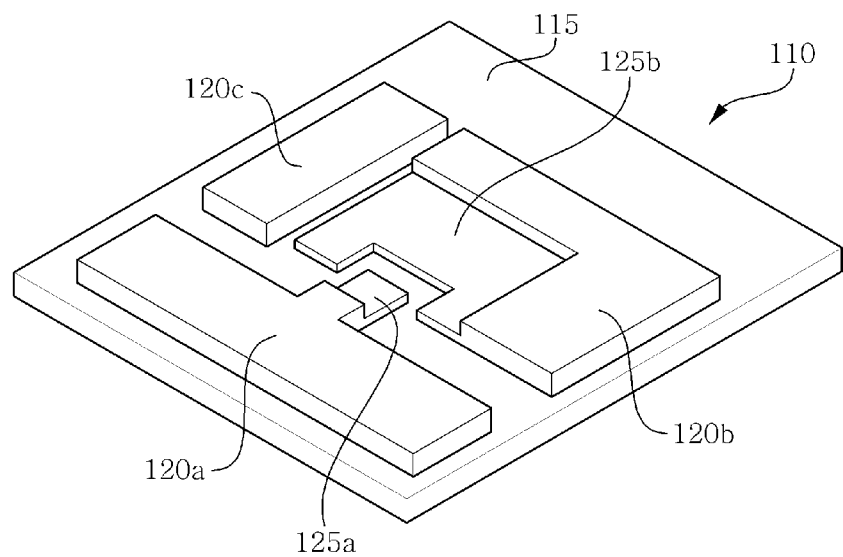
FIG. 5 is a perspective view showing the circuit board on which the gate, emitter, and collector patterns are formed in the power semiconductor module according to the preferred embodiment of the present invention.

FIG. 1 is a perspective view showing a structure of a power semiconductor module according to a preferred embodiment of the present invention; FIG. 2 is a cross-sectional view taken along line A-A' in the structure in the power semiconductor module of FIG. 1; FIGS. 3A and 3B are, respectively, plane views showing upper and lower surfaces of an insulated gate bipolar transistor (IGBT); FIG. 4 is a plan view showing a circuit board in the power semiconductor module according to the preferred embodiment of the present invention; and FIG. 5 is a perspective view showing the circuit board.

Referring to FIG. 1, the power semiconductor module 100 according to the preferred embodiment of the present invention includes a circuit board 110, a first semiconductor chip 130, a second semiconductor chip 140, a first conductive connection member 150a, and a second conductive connection member 150b.

According to the present embodiment, the circuit board 110 may have a form in which metal patterns are formed on an insulation substrate 115.

That is, as shown in FIG. 4, in the circuit board 110 according to the present embodiment, a gate pattern 120a, an emitter pattern 120b, and a collector pattern 120c are formed on the insulation substrate 115.

Here, the insulation substrate 115 may be a ceramic substrate, a metal substrate having an anodized layer, or a printed circuit board, but is not particularly limited thereto.

The ceramic substrate may be made of metal based nitride or a ceramic material. Here, the metal based nitride may include aluminum nitride (AlN) or silicon nitride (SiN) and the ceramic material may include aluminum oxide ($Al_2O_3$) or beryllium oxide (BeO), but are not particularly limited thereto.

Meanwhile, the metal substrate may be made of, for example, aluminum (Al) which is a metal material capable of being easily obtained at a relatively low cost and has significantly excellent heat transfer characteristics, or an alloy thereof.

In addition, the anodized layer which is formed by immersing the metal substrate made of aluminum or an alloy thereof in an electrolyte solution such as boric acid, phosphoric acid, sulfuric acid, chromic acid, or the like, and then applying an anode to the metal substrate and applying a cathode to the electrolyte solution, has insulation characteristics and relatively high heat transfer characteristics of about 10 to 30 W/mk.

As described above, the anodized layer made of aluminum or an alloy thereof may be an aluminum anodized layer ($Al_2O_3$).

Since the anodized layer has insulation characteristics, it enables a circuit layer to be formed on the circuit substrate 110. In addition, since the anodized layer may be formed at a thickness thinner than that of a general insulation layer, it enables thinness simultaneously with further improving heat radiating performance.

Each of the patterns, that is, the gate pattern 120a, the emitter pattern 120b, and the collector pattern 120c may be made of copper (Cu), nickel (Ni), silver (Ag), or gold (Au), but the metal layer is not particularly limited thereto.

In addition, each pattern may be formed by a chemical vapor deposition (CVD) method, a physical vapor deposition (PVD) method, an electroplating process or an electroless plating process, or a sputtering process, but is not particularly limited thereto. It may be appreciated by those skilled in the art that all known metal layer forming processes may be used.

According to the present embodiment, as shown in FIG. 4, the gate pattern 120a may be formed to have a protrusion part, and the emitter pattern 120b may be formed to have a concave part corresponding to the protrusion part.

Figure 3:
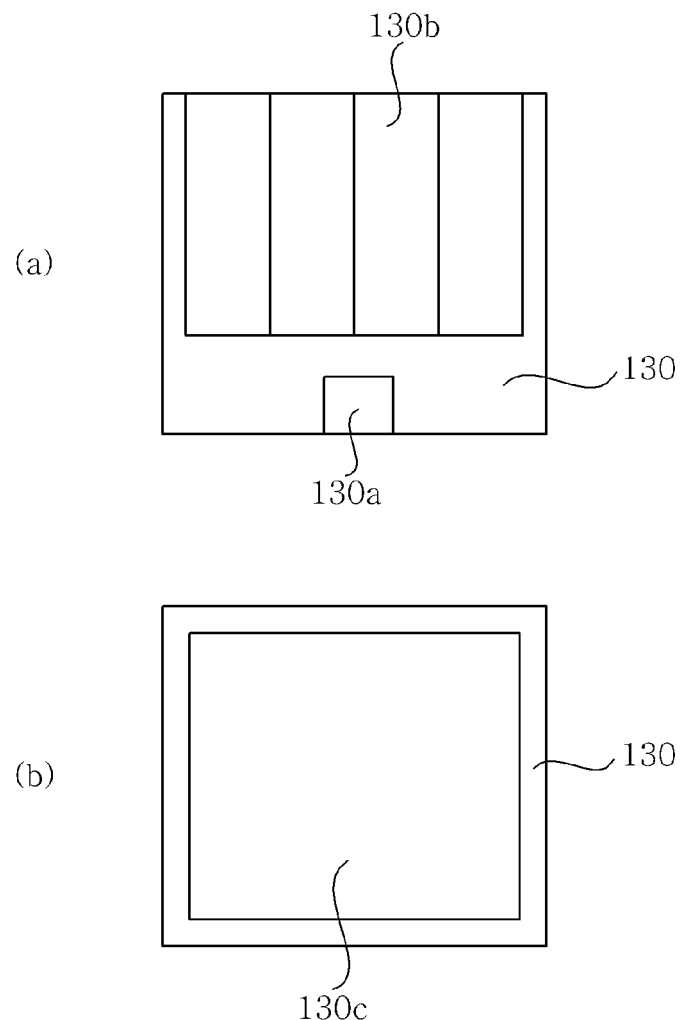
FIG. 3A is a view showing terminals formed on an upper portion of an insulated gate bipolar transistor (IGBT)
FIG. 3B is a view showing terminals formed on a lower portion of the IGBT.

These patterns are formed to have shapes corresponding to those of a gate terminal 130a and an emitter terminal 130b formed on an upper surface of an insulated gate bipolar transistor (IGBT) 130 as shown in FIG. 3.

Although each pattern of the circuit board 110 is formed to have shapes as shown in FIG. 4 in the present embodiment, it is only an example. It may be appreciated by those skilled in the art that each pattern of the circuit board 110 needs to be formed to have shapes corresponding to those of terminals of a semiconductor chip to be flip-chip bonded.

Referring to FIG. 4, an area to which an upper surface of the first semiconductor chip 130 is to be flip-chip bonded in the patterns formed on the circuit board 110 is shown. Hereinafter, an area to which the first semiconductor chip 130 is to be bonded will be referred to a first area 125, and an area other than the area to which the first semiconductor chip 130 is to be bonded will be referred to as a second area.

The circuit board 110 according to the present embodiment may be formed in a concave groove shape so that the first area 125 corresponding to the area to which the first semiconductor chip 130 is bonded is stepped with respect to the second area.

That is, as shown in FIG. 5, a gate pattern portion 125a and an emitter pattern portion 125b of the first area 125 to which the first semiconductor chip 130 is to be bonded is formed in a step shape so as to have a height lower than that of the gate pattern 120a and the emitter patter 120b that correspond to the second area, such that the first area 125 is formed in a concave groove shape.

Generally, when a semiconductor chip is soldering-bonded by a reflow process, a phenomenon in which the semiconductor chip self-aligns or rotates to thereby be out of its original position occurs. In the case in which the semiconductor chip is out of its original position due to this phenomenon, when another semiconductor chip is stacked on the semiconductor chip in a subsequent process, it is difficult to align therebetween.

However, as described above in the present embodiment, the first area 125 corresponding to the area to which the first semiconductor chip 130 is bonded is formed in a concave groove shape so as to be stepped with respect to an area other than the first area 125 to prevent the first semiconductor chip 130 from being rotated by a step part between the first area 125 and the second area at the time of bonding of the first semiconductor chip 130, thereby making it possible to prevent the first semiconductor chip 130 from being out of its original position.

As described above, a phenomenon in which the first semiconductor chip 130 bonded at a lowest portion among a plurality of stacked semiconductor chips is out of its original position is prevented, thereby making it possible to easily align second and third semiconductor chips at the time of subsequent stacking of them.

According to the present embodiment, the first semiconductor chip 130 may include a transistor, for example, an insulated gate bipolar transistor (IGBT), a power transistor, a metal oxide semiconductor (MOS) transistor, and the like, but is not particularly limited thereto.

According to the present embodiment, the first semiconductor ship 130 includes the gate and emitter terminals formed on one surface thereof as shown in FIG. 3A and the collector terminal 130c formed on the other surface thereof as shown in FIG. 3B.

According to the present embodiment, the first semiconductor chip 130 may be mounted so that one surface thereof contacts the circuit board 110, that is, each of the gate terminal 130a and the emitter terminal 130b of the first semiconductor chip 130 contacts the gate pattern 120a and the emitter pattern 120b of the circuit board 110, but is not particularly limited thereto.

According to the present embodiment, the semiconductor chip 140 may be a diode, but is not particularly limited thereto.

That is, although a structure in which the first semiconductor chip 130, which is a transistor, is mounted on the circuit board 110 and the semiconductor chip 140, which is a diode, is mounted on the first semiconductor chip 130 is described by way of example in the present embodiment, the second semiconductor chip 140, which is another transistor, may also be formed on the first semiconductor chip 130, which is a transistor.

Although a diode used as the second semiconductor chip 140 is not shown in the accompanying drawing in the present embodiment, it may have an anode terminal formed on one surface thereof and a cathode terminal formed on the other surface thereof.

Referring to FIG. 2, although the second semiconductor chip 140 is connected in reverse parallel with the first semiconductor chip 130 by having the cathode terminal contacting the collector terminal 130c of the first semiconductor chip 130 in the present embodiment, another semiconductor chip and the first semiconductor chip 130 may also be implemented so that they are connected in parallel with each other.

According to the present embodiment, the first and second conductive connection members 150a and 150b may be made of a metal and have a ribbon shape having a wide width, but is not particularly limited thereto.

In addition, according to the present embodiment, the first and second conductive connection members 150a and 150b may be made of copper (Cu) having high thermal conductivity, but is not particularly limited thereto.

Generally, in the case of a transistor, a large amount of heat is generated in a collector terminal side, and in the case of a diode, a large amount of heat is generated in a cathode terminal side. According to the prior art, a transistor is mounted on a substrate so that a surface on which a collector terminal is formed contacts the substrate, a diode is mounted on the substrate so that a surface on which a cathode terminal is formed contacts the substrate, and a separate heat radiating plate is provided on a lower portion of the substrate, thereby improving heat radiating characteristics.

However, according to the present embodiment, as shown in FIGS. 1 and 2, the first semiconductor chip 130 is mounted so that a surface on which a collector terminal 130c is formed is directed upwardly, the second semiconductor chip 140 is mounted so that a surface on which a cathode terminal contacts the collector terminal 130c, and the first conductive connection member 150a made of copper having high thermal conductivity and having a ribbon shape with a wide width is disposed between the first and second semiconductor chips 130 and 140, thereby making it possible to easily radiate heat generated from the first and second semiconductor chips 130 and 140.

Through the above-mentioned structure, the power semiconductor module according to the present embodiment may efficiently perform heat radiation without a separate heat radiating plate provided on a lower portion of the circuit board 110.

In addition, although not shown in the accompanying drawings, according to the present embodiment, bonding layers for bonding may be formed between the circuit board 110 and the first semiconductor chip 130, between the first semiconductor chip 130 and the first conductive connection member 150a, between the first conductive connection member 150a and the second semiconductor chip 140, and between the second semiconductor ship 140 and the second conductive connection member 150b.

Here, the bonding layer may be made of solder, conductive epoxy, or the like, but is not particularly limited thereto.

As described above, the bonding layers are formed to bond the first semiconductor chip 130, the second semiconductor chip 140, the first conductive connection member 150a, and the second conductive member 150b to each other in a flip-chip form, thereby making it possible to simplify a manufacturing process and implement a firm structure by high density stacking.

In addition, the power semiconductor module 100 according to the present embodiment may further include a separate heat radiating plate (not shown) provided on a lower portion of the circuit board 110 in order to further improve heat radiating characteristics. In addition, after a separate insulation layer is formed on the second conductive connection member 150b, a separate heat radiating plate (not shown) may be further formed on the insulation layer.

According to the preferred embodiments of the present invention, power devices are stacked through flip-chip bonding, thereby making it possible to improve reliability of a product simultaneously with securing electrical connection to a circuit, as compared to the connection through wire bonding according to the prior art.

In addition, according to the preferred embodiments of the present invention, a metal ribbon having a wide width is used instead of a wire to facilitate radiation of heat generated from a power device, thereby making it possible to improve heat radiating characteristics of a product.

Further, according to the preferred embodiments of the present invention, a power device is flip-chip mounted on a substrate on which all of gate, emitter, and collector patterns are formed, thereby making it possible to obtain a power semiconductor module having high density and a firm structure.

Although the preferred embodiments of the present invention have been disclosed for illustrative purposes, they are for specifically explaining the present invention and thus a power semiconductor module according to the present invention is not limited thereto, but those skilled in the art will appreciate that various modifications, additions and substitutions are possible, without departing from the scope and spirit of the invention as disclosed in the accompanying claims.

Accordingly, any and all modifications, variations or equivalent arrangements should be considered to be within the scope of the invention, and the detailed scope of the invention will be disclosed by the accompanying claims.

What is claimed is:

1. A power semiconductor module comprising:
a circuit board having gate, emitter, and collector patterns formed thereon;
a first semiconductor chip mounted on the circuit board, having gate and emitter terminals each formed on one surface thereof and contacting the gate and emitter patterns, and having a collector terminal formed on the other surface thereof;
a second semiconductor chip mounted on the first semiconductor chip, having a cathode terminal formed on one surface thereof and contacting the collector terminal, and having an anode terminal formed on the other surface thereof;
a first conductive connection member having one end disposed between and in contact with the collector terminal of the first semiconductor chip and the cathode terminal of the second semiconductor chip and the other end contacting the collector pattern of the circuit board, the one and the other ends of the first conductive connection member being integrally formed with each other; and
a second conductive connection member having one end contacting the anode terminal of the second semiconductor chip and the other end contacting the emitter pattern of the circuit board,
wherein the collector terminal of the first semiconductor chip and the cathode terminal of the second semiconductor chip face each other, and
wherein a first area is a portion under the first semiconductor chip contacted in the gate and emitter patterns formed on the circuit board, a circumference of the first area is a second area, a portion formed at the first area of the gate pattern has a thickness thinner than a portion formed at the second area of the gate pattern, a portion formed at the first area of the emitter pattern has a thickness thinner than a portion formed at the second area of the emitter pattern, and a portion formed at the first area of the gate pattern has a thickness identical to the portion formed at the first area of the emitter pattern.

2. The power semiconductor module as set forth in claim 1, wherein the first and second conductive connection members are made of a metal and have a ribbon shape.

3. The power semiconductor module as set forth in claim 2, wherein the metal is copper (Cu).

4. The power semiconductor module as set forth in claim 1, wherein the first semiconductor chip is an insulated gate bipolar transistor (IGBT).

5. The power semiconductor module as set forth in claim 1, wherein the second semiconductor chip is a diode.

6. The power semiconductor module as set forth in claim 1, wherein the other end of the first conductive connection member has a bent shape and contacts the collector pattern of the circuit board.

7. The power semiconductor module as set forth in claim 1, wherein the other end of the second conductive connection member has a bent shape and contacts the emitter pattern of the circuit board.

8. The power semiconductor module as set forth in claim 1, wherein the gate and emitter patterns of the circuit board and the gate and emitter terminals of the first semiconductor chip are bonded to each other by soldering.

9. The power semiconductor module as set forth in claim 1, wherein the collector terminal of the first semiconductor chip and the first conductive connection member are bonded to each other by soldering.

10. The power semiconductor module as set forth in claim 1, wherein the first conductive connection member and the cathode terminal of the second semiconductor chip are bonded to each other by soldering.

11. The power semiconductor module as set forth in claim 1, wherein the anode terminal of the second semiconductor chip and the second conductive connection member are bonded to each other by soldering.

12. The power semiconductor module as set forth in claim 1, wherein the second conductive connection member and the emitter pattern of the circuit board are bonded to each other by soldering.

* * * * *